(12) United States Patent
Hraimel et al.

(10) Patent No.: US 10,763,636 B2
(45) Date of Patent: Sep. 1, 2020

(54) LASER DEVICE

(71) Applicant: O-NET COMMUNICATIONS (SHENZHEN) LIMITED, Shenzhen (CN)

(72) Inventors: Bouchaib Hraimel, Shenzhen (CN); Zining Huang, Shenzhen (CN)

(73) Assignee: O-NET COMMUNICATIONS (SHENZHEN) LIMITED, Shenzhen (CN)

(*) Notice: Subject to any disclaimer, the term of this patent is extended or adjusted under 35 U.S.C. 154(b) by 0 days.

(21) Appl. No.: 16/289,689

(22) Filed: Mar. 1, 2019

(65) Prior Publication Data

US 2019/0305507 A1 Oct. 3, 2019

Related U.S. Application Data

(63) Continuation of application No. PCT/CN2018/103647, filed on Aug. 31, 2018.

(30) Foreign Application Priority Data

Mar. 29, 2018 (CN) .......................... 2018 1 0272442

(51) Int. Cl.
| | |
|---|---|
| *H01S 3/10* | (2006.01) |
| *H01L 35/28* | (2006.01) |
| *H01S 3/04* | (2006.01) |
| *H05K 1/18* | (2006.01) |

(52) U.S. Cl.
CPC .......... *H01S 3/10084* (2013.01); *H01L 35/28* (2013.01); *H01S 3/0405* (2013.01); *H05K 1/189* (2013.01); *H05K 2201/1003* (2013.01)

(58) Field of Classification Search
CPC ............... H01S 3/10084; H01S 3/0405; H01S 5/02212; H01S 5/0428; H01L 35/28; H05K 1/189; H05K 2201/1003
See application file for complete search history.

(56) References Cited

U.S. PATENT DOCUMENTS

| | | | | |
|---|---|---|---|---|
| 5,602,865 A | * | 2/1997 | Laakmann | H01S 3/0975 372/38.1 |
| 5,953,360 A | * | 9/1999 | Vitruk | H01S 3/0975 372/76 |
| 6,534,974 B1 | * | 3/2003 | Bowen | G11B 5/455 29/603.09 |
| 2004/0202214 A1 | * | 10/2004 | Aronson | H01S 5/0427 372/38.02 |
| 2008/0089381 A1 | * | 4/2008 | Backes | G01C 19/66 372/94 |
| 2017/0098918 A1 | * | 4/2017 | Honda | H01S 3/03 |
| 2018/0181076 A1 | * | 6/2018 | Kramer | G04F 5/14 |
| 2018/0351325 A1 | * | 12/2018 | Tanaka | H01S 5/0427 |

* cited by examiner

*Primary Examiner* — Yuanda Zhang

(57) ABSTRACT

The present disclosure provides a laser device, where the laser device comprises a substrate, a seed laser disposed on the substrate, and a radiofrequency coil. Two connection ends of the radiofrequency coil are connected with corresponding pin ends of the seed laser, respectively.

10 Claims, 2 Drawing Sheets

LASER DEVICE

CROSS-REFERENCE TO RELATED APPLICATIONS

This is a continuation-application of International Application No. PCT/CN2018/103647, with an international filing date of Aug. 31, 2018, which claims foreign priority to Chinese Patent Application No. 201810272442.X, filed on Mar. 29, 2018 in the State Intellectual Property Office of China, the contents of all of which are hereby incorporated by reference.

TECHNICAL FIELD

The present disclosure relates to the technical field of lasers, and in particular to a laser device.

BACKGROUND

A laser device can emit a laser, in particular to seed laser. Under a high current pulse, voltage drop is generated and standing wave between the seed laser and a pulse current driver is generated.

In current solutions, resistance of direct current (DC) is reduced via increasing line width and reducing wire length, further reducing the voltage drop. However, the above scheme has high difficulty because of the technology, high cost, and unstable performance, which is inconvenient to mass production of products.

SUMMARY

The technical problem solved by the present disclosure is to provide a detection system for an optical module capable of determining connection of periodic line is normal by detecting capacitance value of the periodic line, further avoiding failure product inflow client.

In order to solve the technical problem mentioned above, the present disclosure provides a laser device, where the laser device comprises a substrate, a seed laser disposed on the substrate, and a radiofrequency coil. Two connection ends of the radiofrequency coil are connected with corresponding pin ends of the seed laser, respectively.

Furthermore, characteristic impedance of the radiofrequency coil matches with characteristic impedance of the seed laser.

Furthermore, the substrate is a printed circuit board (PCB) and the radiofrequency coil is disposed on a first end surface of the PCB, and the two pin ends of the seed laser are disposed on a second end surface of the PCB.

Furthermore, through-hole of the PCB is located in interval of wire wrapping of the radiofrequency coil; a plurality of the connection pins are disposed on the end surface of the PCB; two connection pins of the end surface of the PCB are connected with the pin ends of the seed laser, respectively; two connection pins of the end surface of the PCB are connected with two connection ends of the radiofrequency coil.

Furthermore, the laser device further comprises a semiconductor cooler disposed on the substrate.

Furthermore, the laser device further comprises temperature sensor disposed on the substrate.

Furthermore, the PCB is a flexible PCB.

Furthermore, the laser device further comprises a RC buffer circuit connected in parallel with the laser.

Furthermore, the laser device further comprises a housing. The substrate is disposed in the housing, and the housing is connected with the connection pins of the substrate.

Furthermore, the radiofrequency coil is one of a square coil, a quasi-square coil, a circular coil, and a quasi-circular coil.

The benefit effects of the present disclosure are: compared with the prior art, the present disclosure uses the laser device, where the seed laser and the radiofrequency coil are disposed on the substrate. Two connection ends of the radiofrequency coil are connected with corresponding pin ends of the seed laser, respectively, which achieve low inductance, reduces the voltage drop because of high current pulse, reduces electric induction of the seed laser and reduces reflection, further avoiding standing wave between the seed laser and a pulse current driver. A flat-top current passing through the laser is obtained via the RC buffer circuit.

BRIEF DESCRIPTION OF THE DRAWINGS

The present disclosure will be further described with reference to the accompanying drawings and embodiments.

DETAILED DESCRIPTION

The following will clearly and completely describe the technical solutions in the embodiments of the present disclosure with reference to the accompanying drawings in the embodiments of the present disclosure.

Figure 1:
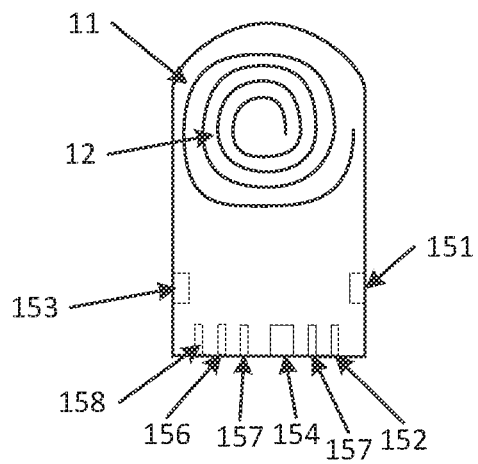
FIG. 1 is a structural diagram of a first end surface of a laser device of the present disclosure.
Figure 2:
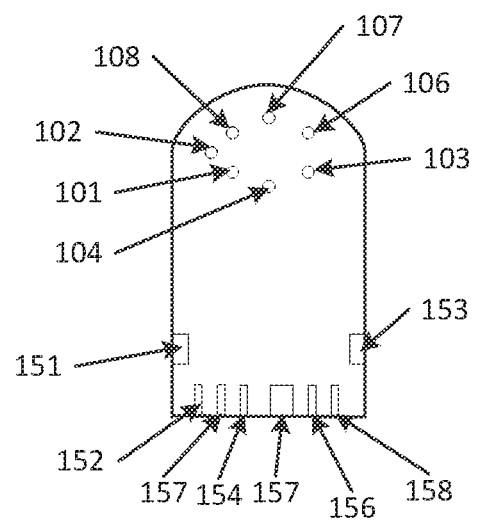
FIG. 2 is a structural diagram of a second end surface of the laser device of FIG. 1 of the present disclosure.

As shown in FIG. 1 and FIG. 2, the present disclosure provides an embodiment of a laser device.

The laser device comprises a substrate 11, a seed laser disposed on the substrate 11 (not shown in drawings) and a radiofrequency coil 12. Two connection ends of the radiofrequency coil 12 are connected with corresponding pin ends of the seed laser, respectively.

Furthermore, a packaging of the seed laser is a packaging of a TO-CAN. Structure of the substrate 11 matches with the packaging of the TO-CAN, such as a top portion of the substrate is semicircle, a bottom portion of the substrate is rectangle, and a width of the rectangle is greater than a diameter of the semicircle. Thus, the substrate 11 is easy to covers on the packaging of the TO-CAN. The semicircle corresponds to a top portion of the packaging of the TO-CAN, and the rectangle is convenient to solder flexible board.

To be specific, the two connection ends of the radiofrequency coil 12 are one end of an outermost ring and one end of an innermost ring of the radiofrequency coil 12, respectively. Two connection ends of the radiofrequency coil 12 are connected with corresponding pin ends of the seed laser by short circuit, respectively, which has low inductance, reduces the voltage drop because of high current pulse. Thus, inductance value of the radiofrequency coil 12 is controlled via controlling line width and line length of the radiofrequency coil 12.

Furthermore, the radiofrequency coil 12 is one of a square coil, a quasi-square coil, a circular coil, and a quasi-circular coil.

In the embodiment, the present disclosure provides characteristic impedance of the radiofrequency coil 12.

Impedance of the above two connection ways is inconsistent to increase high-frequency loss and generate high-frequency reflection, further affecting signal quality. The characteristic impedance of the radiofrequency coil 12 matches with characteristic impedance of the seed laser. Namely radio frequency (RF) impedance of the radiofrequency coil 12 is consistent with the impedance of the seed laser.

Furthermore, the radiofrequency coil 12 needs to make RF simulation to satisfy requirement that the characteristic impedance of the radiofrequency coil 12 matches with the characteristic impedance of the seed laser.

To be specific, the characteristic impedance of pin of the seed laser need to be consistent with the characteristic impedance of the radiofrequency coil 12. The seed laser is disposed on a carrier of a transmission line matching with laser resistance. The pins (namely anode and cathode) of the radiofrequency coil 12 are shorted and connected with corresponding positions of the PCB (namely pins of the seed laser), which reduces electric induction of the seed laser and reduces reflection, further avoiding standing wave between the seed laser and a pulse current driver.

In the embodiment, the present disclosure provides the substrate 11.

The substrate 11 is regarded as the PCB and the radiofrequency coil 12 is disposed on the end surface of the PCB. Through-hole of the PCB is located in interval of wire wrapping of the radiofrequency coil 12. A plurality of the connection pins are disposed on the end surface of the PCB. Two connection pins of the end surface of the PCB are connected with the pin ends of the seed laser, respectively. And two connection pins of the end surface of the PCB are connected with two connection ends of the radiofrequency coil 12.

To be specific, the connection pins of the end surface of the PCB at least comprise cathode terminals 154 of the seed laser and anode terminals 157 of the seed laser. The pin ends of the seed laser comprises cathode hole 104 of the seed laser and anode holes 107 of the seed laser, which both are used to fix and connect the cathode terminals 154 of the seed laser and the anode terminals 157 of the seed laser. The two connection ends of the radiofrequency coil 12 are connected with the cathode terminals 154 of the seed laser and the anode terminals 157 of the seed laser, respectively. Or the two connection ends of the radiofrequency coil 12 are connected with the cathode hole 104 of the seed laser and the anode holes 107 of the seed laser, respectively.

Furthermore, the laser device further comprises a housing. The substrate 11 is disposed in the housing, and the housing is connected with the connection pins 153.

Furthermore, the PCB is a flexible PCB. Slots (connection pin 151 and connection 153) are located on the PCB to locate the flexible PCB and avoid damage.

In the embodiment, the present disclosure provides other element.

The laser device further comprises a semiconductor cooler disposed on the substrate 11. The semiconductor cooler is also called as a thermoelectric cooler and is a kind of heat pump. The semiconductor cooler has no sliding component and applies to a situation that limited space, high reliability, and no refrigerant pollution. Working operation of the semiconductor cooler is direct current (DC), which can make cool and heat. The cooling or heating of the semiconductor cooler is realized by changing polarity of the DC, the above effect is generated via principle of thermoelectricity.

To be specific, the connection pins at least comprises cathode terminals (namely pin 151) of the semiconductor cooler and anode terminals 152 of the semiconductor cooler. The pin ends comprises cathode hole 101 of the semiconductor cooler and anode holes 102 of the semiconductor cooler, which both are used to fix and connect the two connection pins of the semiconductor cooler.

The laser device further comprises temperature sensor disposed on the substrate 11. Furthermore, the temperature sensor is photo-resistance.

To be specific, the connection pins at least comprises cathode terminals 156 of the semiconductor cooler and anode terminals 158 of the temperature sensor. The pin ends comprise cathode hole 106 of the temperature sensor and anode holes 108 of the temperature sensor, which both are used to fix and connect the two connection pins of the temperature sensor.

Figure 3:
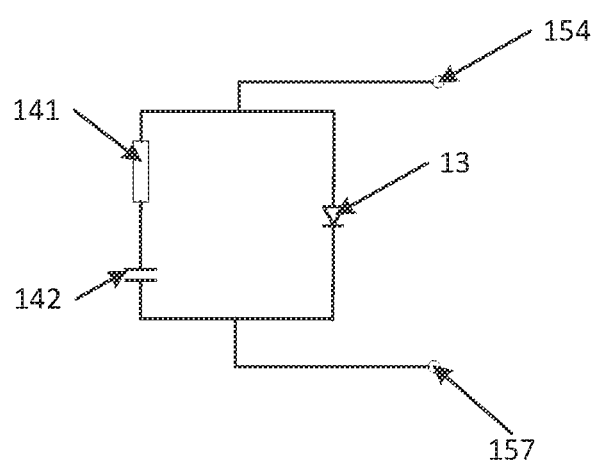
FIG. 3 is a structural diagram of a processing chip connected with a printed circuit board interface of the present disclosure.

As shown in FIG. 3, the present disclosure provides a laser circuit of an embodiment.

The laser device further comprises a RC buffer circuit connected in parallel with the laser. The RC buffer circuit comprises a resistor 141 and a capacitor 142 connected in series with the resistor.

A flat-top current passing through the laser is obtained via the RC buffer circuit, so that ultra-narrow light pulse of a sub-nanosecond width (0.5 ns) is obtained. The fastest rising/falling time are several picoseconds (70 Ps) without oscillation and overshoot/blanking phenomena, so that it is ideal for long-distance laser radar.

The foregoing descriptions are merely implementation manners of the present disclosure, and therefore do not limit the scope of patents of the present disclosure. Any equivalent structure or equivalent process transformation using the description of the present disclosure and the accompanying drawings may be directly or indirectly applied to other related technologies. The same applies in the field of patent protection of this disclosure.

What is claimed is:

1. A laser device, comprising:
   a substrate;
   a seed laser disposed on the substrate; and
   a radiofrequency coil;
   wherein two connection ends of the radiofrequency coil are connected with corresponding pin ends of the seed laser, respectively;
   wherein characteristic impedance of the radio frequency coil matches with characteristic impedance of the seed laser;
   wherein the substrate is a printed circuit board (PCB) and the radiofrequency coil is disposed on a first end surface of the PCB, and the two pin ends of the seed laser are disposed on a second end surface of the PCB;
   wherein a through-hole of the PCB is located in an interval of a wire wrapping of the radiofrequency coil; a plurality of connection pins are disposed on the first and/or second end surface of the PCB; two connection pins of the first and/or second end surface of the PCB are connected with the pin ends of the seed laser, respectively; two connection pins of the first and/or second end surface of the PCB are connected with two connection ends of the radiofrequency coil.

2. The laser device according to claim 1, wherein the laser device further comprises a semiconductor cooler disposed on the substrate.

3. The laser device according to claim 1, wherein the laser device further comprises a temperature sensor disposed on the substrate.

4. The laser device according to claim 1, wherein the PCB is a flexible PCB.

5. The laser device according to claim 1, wherein the PCB is a flexible PCB.

6. The laser device according to claim 2, wherein the PCB is a flexible PCB.

7. The laser device according to claim 3, wherein the PCB is a flexible PCB.

8. The laser device according to claim 1, wherein the laser device further comprises a RC buffer circuit connected in parallel with the laser.

9. The laser device according to claim 1, wherein the laser device further comprises a housing; the substrate is disposed in the housing, and the housing is connected with the connection pins of the substrate.

10. The laser device according to claim 1, wherein the radiofrequency coil is one of a square coil, a quasi-square coil, a circular coil, and a quasi-circular coil.

* * * * *